(12) United States Patent
Harayama

(10) Patent No.: US 10,870,225 B2
(45) Date of Patent: Dec. 22, 2020

(54) IMPRINT APPARATUS AND ARTICLE MANUFACTURING METHOD

(71) Applicant: CANON KABUSHIKI KAISHA, Tokyo (JP)

(72) Inventor: Tomohiro Harayama, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 258 days.

(21) Appl. No.: 15/827,398

(22) Filed: Nov. 30, 2017

(65) Prior Publication Data

US 2018/0154559 A1    Jun. 7, 2018

(30) Foreign Application Priority Data

Dec. 6, 2016    (JP) .................................. 2016-237089

(51) Int. Cl.
*B29C 43/58*    (2006.01)
*B29C 43/02*    (2006.01)
(Continued)

(52) U.S. Cl.
CPC ............ *B29C 43/58* (2013.01); *B29C 43/021* (2013.01); *G03F 7/0002* (2013.01); *B29C 43/04* (2013.01); *B29C 43/36* (2013.01); *B29C 2043/023* (2013.01); *B29C 2043/025* (2013.01); *B29C 2043/3605* (2013.01); *B29C 2043/5808* (2013.01); *B29C 2043/5825* (2013.01); *B29C 2043/5833* (2013.01)

(58) Field of Classification Search
CPC ....... B29C 43/58; B29C 43/021; B29C 43/04; B29C 43/36; B29C 59/02; B29C 59/022; B29C 59/026; G03F 7/0002
See application file for complete search history.

(56) References Cited

U.S. PATENT DOCUMENTS 9,285,675 B2    3/2016   Hamaya et al.
2007/0114686 A1    5/2007   Choi et al.
(Continued)

FOREIGN PATENT DOCUMENTS

KR    1020050065839 A    6/2005
SG    10201610181 T    7/2017

OTHER PUBLICATIONS

Office Action issued in Taiwanese Appln. No. 106140228 dated Nov. 13, 2018. English Translation provided.
(Continued)

*Primary Examiner* — Joseph S Del Sole
*Assistant Examiner* — Mohamed K Ahmed Ali
(74) *Attorney, Agent, or Firm* — Rossi, Kimms & McDowell LLP

(57) ABSTRACT

An imprint apparatus includes a mold holder that holds a mold, a substrate holder that holds a substrate by suction, a driving device that brings the mold into contact with an imprint material on the substrate by relatively bringing the mold holder and the substrate holder close to each other, and a controller. The controller controls the driving device so as to bring the mold into contact with the imprint material in a state in which the substrate is deformed into a convex shape with respect to the mold by controlling pressures inside the plurality of suction regions based on surface shape data of the substrate held by the substrate holder.

16 Claims, 13 Drawing Sheets

(51) Int. Cl.
  *B29C 43/04* (2006.01)
  *B29C 43/36* (2006.01)
  *G03F 7/00* (2006.01)

(56) References Cited

U.S. PATENT DOCUMENTS

| | | |
|---|---|---|
| 2007/0164476 A1 | 7/2007 | Wu |
| 2010/0072652 A1 | 3/2010 | Ganapathisubramanian |
| 2013/0056905 A1* | 3/2013 | Hamaya ................ G03F 7/0002 264/293 |
| 2013/0112097 A1* | 5/2013 | Nakagawa ............ G03F 7/0002 101/483 |
| 2013/0134616 A1* | 5/2013 | Sato ...................... G03F 7/0002 264/40.5 |
| 2013/0134630 A1* | 5/2013 | Miyata ................... B29C 59/02 264/293 |
| 2014/0320842 A1 | 10/2014 | Sato |
| 2016/0129612 A1 | 5/2016 | Seki et al. |
| 2016/0129614 A1 | 5/2016 | Yamazaki et al. |
| 2016/0297136 A1 | 10/2016 | Wakabayashi |
| 2017/0165898 A1 | 6/2017 | Meissl |

OTHER PUBLICATIONS

Search Report and Written Opinion issued in Singaporean Appln. No. 10201709841X dated Jul. 1, 2020.
Office Action issued in Korean Application No. 10-2017-0165626 dated May 25, 2020.

* cited by examiner

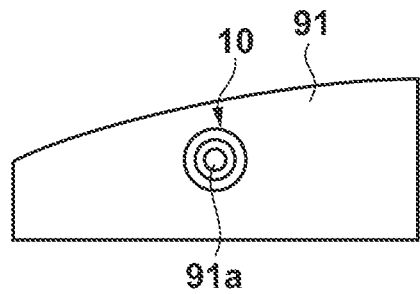
FIG. 10A
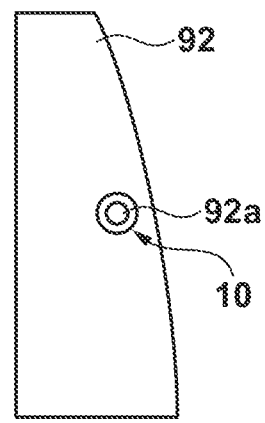
FIG. 10B
FIG. 11
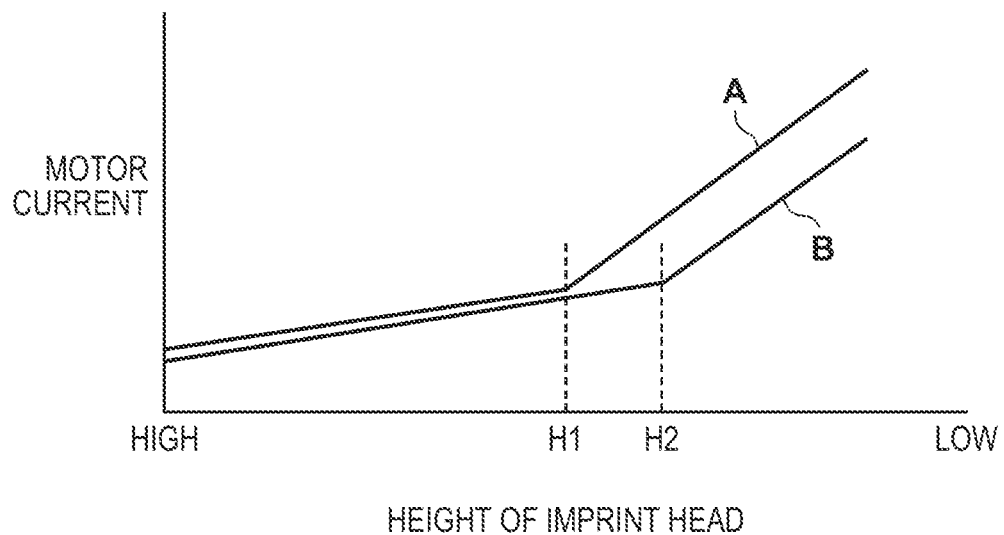

F I G. 14

| INTERNAL PRESSURE $Pa_1$ $Pb_1$ $Pc_1$ | | INTERNAL PRESSURE $Pa_2$ $Pb_2$ $Pc_2$ | | INTERNAL PRESSURE ... | | INTERNAL PRESSURE $Pa_i$ $Pb_i$ $Pc_i$ | |
|---|---|---|---|---|---|---|---|
| COORDINATE | THREE-DIMENSIONAL SHAPE | COORDINATE | THREE-DIMENSIONAL SHAPE | COORDINATE | THREE-DIMENSIONAL SHAPE | COORDINATE | THREE-DIMENSIONAL SHAPE |
| $X_{11}$ $Y_{11}$ | $Z_{11}$ | $X_{12}$ $Y_{12}$ | $Z_{12}$ | . . | . | $X_{1i}$ $Y_{1i}$ | $Z_{1i}$ |
| $X_{21}$ $Y_{21}$ | $Z_{21}$ | $X_{22}$ $Y_{22}$ | $Z_{22}$ | . . | . | $X_{2i}$ $Y_{2i}$ | $Z_{2i}$ |
| . . | . | . . | . | . . | . | . . | . |
| . . | . | . . | . | . . | . | . . | . |
| $X_{n1}$ $Y_{n1}$ | $Z_{n1}$ | $X_{n2}$ $Y_{n2}$ | $Z_{n2}$ | . . | . | $X_{ni}$ $Y_{ni}$ | $Z_{ni}$ |

CL1, CL2, CL3

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

An imprint technique is coming into practical use as one lithography technique of manufacturing articles such as magnetic storage media and semiconductor devices. In an imprint apparatus, a pattern is formed by bringing a mold into contact with an imprint material on a substrate. A pattern defect may be caused at this time, and a reduction in this defect is a task. One factor in causing the pattern defect is that bubbles are trapped between the mold and the imprint material on the substrate when a pattern portion of the mold and the imprint material are brought into contact with each other. If the imprint material is cured while the bubbles remain, an unfilled defect may be caused in the formed pattern.

In US-2007-0114686, when a mold is brought into contact with an imprint material on a substrate, a pattern portion at the center of the mold is deformed into a convexity on a substrate side to gradually bring the mold into contact with the imprint material from the center to the outside, reducing remaining bubbles. To put it another way from a substrate-side point of view, contact between the mold and the imprint material is started near the center of a shot region on the substrate, and a contact region is extended outside the shot region.

From the viewpoint of productivity, however, the same imprint performance as in a normal shot region is required not only in a shot region at the center of the substrate but also in a peripheral shot region (deficient shot region) partially extending off the circumferential portion of the substrate.

SUMMARY OF THE INVENTION

The present invention provides, for example, an imprint apparatus advantageous in terms of productivity.

According to one aspect of the present invention, an imprint apparatus that performs an imprint process of forming a pattern by bringing a mold into contact with an imprint material on a substrate is provided. The imprint apparatus comprises a mold holder configured to hold the mold, a substrate holder configured to hold the substrate by suction, a driving device configured to bring the mold into contact with the imprint material by relatively bringing the mold holder and the substrate holder close to each other, and a controller configured to control the driving device so as to bring the mold into contact with the imprint material in a state in which the substrate is deformed into a convex shape with respect to the mold by controlling, based on surface shape data of the substrate held by the substrate holder, a pressure at which the substrate holder sucks the substrate.

Further features of the present invention will become apparent from the following description of exemplary embodiments (with reference to the attached drawings).

BRIEF DESCRIPTION OF THE DRAWINGS

FIGS. 10A and 10B are views each showing an example of an image shot by a camera in the peripheral shot region at the time of imprint;

FIG. 11 is a graph showing the relationship between the height of an imprint head and the driving current of a motor in a mold driving mechanism;

FIG. 14 is a table showing an example of the data structure of the map data;

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the following embodiments are not intended to limit the present invention and are merely concrete examples for practicing the invention. Also, not all combinations of features to be described in the embodiments are indispensable for the means to solve the problems according to the present invention.

First Embodiment

First, an overview of an imprint apparatus according to an embodiment will be described. The imprint apparatus is an apparatus that brings an imprint material supplied onto a substrate into contact with a mold, and applies curing energy to the imprint material, forming the pattern of a cured product to which the three-dimensional pattern of the mold has been transferred.

A curable composition (may also be referred to as an uncured resin) which is cured by receiving curing energy is used for the imprint material. An electromagnetic wave, heat, or the like can be used as the curing energy. For example, light such as infrared light, visible rays, ultraviolet light, or the like whose wavelength is selected from a range of 10 nm (inclusive) to 1 mm (inclusive) can be used as the electromagnetic wave. The curable composition can be a composition that is cured by light irradiation or application of heat. Out of these, a photo-curable composition that is cured by light irradiation contains at least a polymerizable compound and a photopolymerization initiator, and may further contain a non-polymerizable compound or solvent as needed. The non-polymerizable compound is at least a material selected from the group consisting of a sensitizer, a hydrogen donor, an internal mold release agent, a surfactant, an antioxidant, a polymer component, and the like. The imprint material supply apparatus (not shown) can arrange, on the substrate, the imprint material having a droplet-like shape, or an island-like shape or a film-like shape formed by a plurality of droplets connected to each other. The viscosity (viscosity at 25° C.) of the imprint material can be set at, for example, 1 mPa·s (inclusive) to 100 mPa·s (inclusive). For example, glass, ceramics, a metal, a semiconductor, a resin, or the like can be used as a material of the substrate. A member made of a material different from that for the substrate may be provided on the surface of the substrate, as needed. For example, a silicon wafer, a compound semiconductor wafer, silica glass, or the like is used as the substrate.

Figure 1:
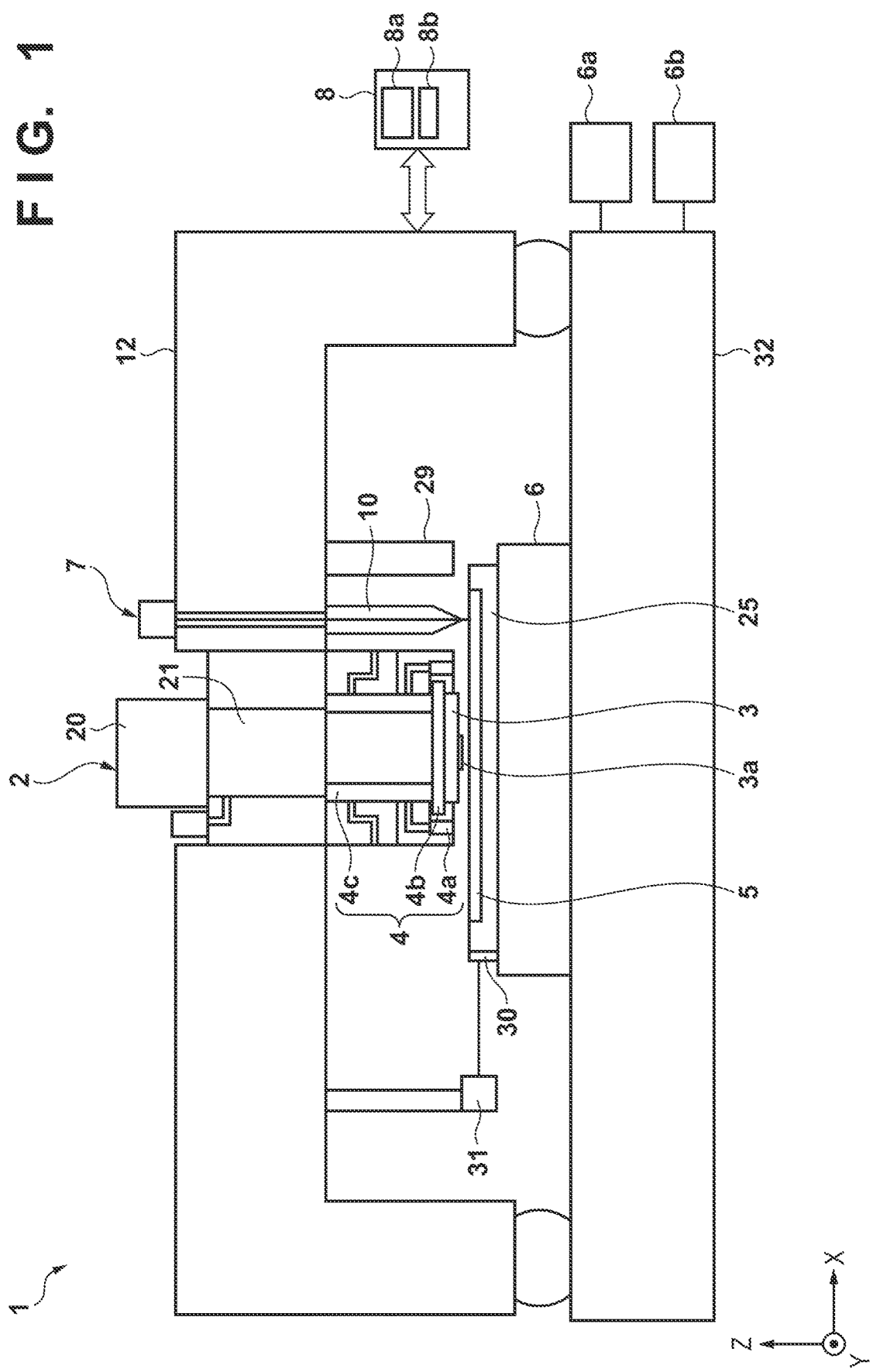
FIG. 1 is a view showing the arrangement of an imprint apparatus according to an embodiment.

FIG. 1 is a view showing the arrangement of an imprint apparatus 1 according to an embodiment. In this embodiment, the imprint apparatus 1 adopts a photo-curing method of curing the imprint material by ultraviolet irradiation. However, the present invention is not limited to this and can also adopt, for example, a heat-curing method of curing the imprint material by inputting heat. Note that throughout the drawings below, a Z-axis in an X-Y-Z coordinate system is set in a direction parallel to the irradiation axis of ultraviolet light with respect to the mold, and an X-axis and a Y-axis are set in directions perpendicular to each other in a plane perpendicular to the Z-axis.

The imprint apparatus 1 includes an illumination system unit 2, an imprint head 4 that holds a mold 3, a substrate stage 6 that holds a substrate 5, a dispenser 7 that supplies an imprint material 10, and a controller 8. A structure 12 supports the illumination system unit 2, the imprint head 4, and the dispenser 7.

The illumination system unit 2 irradiates the mold 3 with ultraviolet light in an imprint process. The illumination system unit 2 includes a light source 20 and an illumination optical system 21 configured to adjust ultraviolet light emitted from the light source 20 to light suitable for imprint. For example, a halogen lamp that generates ultraviolet light can be used as the light source 20. The illumination optical system 21 can include an optical element such as a lens, an aperture (opening), a shutter that switches between irradiation and light shielding, and the like (all of which are not shown).

The mold 3 has, for example, the periphery of an almost rectangle and includes a mesa portion 3a of a pattern portion in which a predetermined pattern (for example, a three-dimensional pattern such as a circuit pattern) is formed three-dimensionally. The material of the mold 3 can be a material, such as silica glass, capable of transmitting ultraviolet light.

The imprint head 4 functions as a mold holder that moves while holding the mold 3. The imprint head 4 can include a shape correction mechanism 4a (magnification correction mechanism), a mold chuck 4b that draws and holds the mold 3 by a suction force, and a mold driving mechanism 4c that drives the mold chuck 4b (that is, the mold 3). The shape correction mechanism 4a includes a plurality of fingers installed so as to face each other with respect to regions on the side surfaces of the periphery of the mold 3 and corrects a pattern formed in the mesa portion 3a to a target shape by driving these fingers to apply a pressure to the mold 3. Note that the configuration of the shape correction mechanism 4a is not limited to this and may be configured to, for example, apply a tensile force to the mold 3.

The mold driving mechanism 4c is a driving system that drives the mold chuck 4b in a Z-axis direction in order to bring the mold 3 into contact with the imprint material 10 supplied onto the substrate 5. The mold driving mechanism 4c may also have an adjustment function of adjusting the position of the mold 3 in X and Y directions or a θ direction (a rotational direction around the Z-axis) and a tilt function of adjusting the tilt of the mold 3. The present invention is not particularly limited to an actuator adopted to this mold driving mechanism 4c and can adopt a linear motor, an air cylinder, or the like.

Each of the substrate stage 6 and a substrate chuck 25 functions as a substrate holder that moves while holding the substrate. The substrate chuck 25 is fixed onto the substrate stage 6. Many holes are provided in the upper surface of the substrate chuck 25. A pressure regulator 6b (for example, a vacuum device) is connected to these holes and configured to exhaust a gas on the upper surface of the substrate chuck 25 through the holes. The substrate 5 is arranged such that its lower surface contacts the upper surface of the substrate chuck 25, and chucked and held by the substrate chuck 25 by causing the pressure regulator 6b to exhaust a gas between the lower surface of the substrate 5 and the upper surface of the substrate chuck 25. The arrangement and control of the substrate chuck 25 will be described in detail later.

The imprint apparatus 1 includes a substrate driving mechanism 6a that drives (positions) the substrate stage 6 (that is, the substrate 5) in the X and Y directions on a platen 32. A measurement device 31 can measure the position of the substrate stage 6 in the X and Y directions. The substrate driving mechanism 6a may further have an adjustment function of adjusting a position in the Z-axis direction and a position in the θ direction (the rotational direction around the Z-axis), and a tilt function of adjusting the tilt of the substrate 5.

The measurement device 31 can be, for example, an interferometer instructed by the structure 12. The measurement device 31 measures the position of the substrate stage 6 by, for example, irradiating the substrate chuck 25 with measurement light and detecting measurement light reflected by a measurement mirror 30 provided on the end face of the substrate chuck 25. Note that FIG. 1 shows only one measurement device 31 but can include the number of measurement devices 31 capable of measuring at least the X and Y positions, rotation amount, and tilt amount of the substrate stage 6.

The imprint apparatus 1 can obtain positional shift information by observing an alignment mark formed on the substrate 5 or substrate chuck 25 by an alignment optical system (not shown). The imprint apparatus 1 can measure a distance to the upper surface of the substrate 5 by a height measurement device 29. The relative heights of the pattern surface of the mold 3 and the height measurement device 29 are measured in advance, obtaining a distance from the upper surface of the substrate 5 to the pattern surface of the mold 3 by calculation. Note that the height measurement device 29 may be an external device of the imprint apparatus 1. In this case, data measured by the height measurement device 29 serving as the external device can be stored in a memory 8b and used in the imprint apparatus 1.

The dispenser 7 supplies the imprint material 10 onto the substrate 5. Subsequently, when the mold driving mechanism 4c moves the mold 3 downward and brings it into contact with the imprint material 10 on the substrate 5, the imprint material 10 flows into an engraved groove of a pattern. The ultraviolet light emitted from the light source 20 passes through the mold 3 via the illumination optical system 21 and enters the imprint material 10 on the substrate 5. The imprint material 10 irradiated with the ultraviolet light is thus cured. The reverse pattern of the pattern of the mold 3 is formed by the cured imprint material. After the imprint material 10 is cured, a spacing between the mold 3 and the substrate 5 is widened by moving the mold 3 upward by the mold driving mechanism 4c, separating the mold 3 from the cured imprint material 10 (mold separation).

Note that the imprint apparatus 1 of this embodiment adopts an arrangement in which the imprint head 4 is driven and brought into contact with the imprint material 10 on the fixed substrate 5 but can also adopt an arrangement opposite to this. That is, the imprint apparatus 1 may adopt an arrangement in which the substrate stage 6 is driven, and the imprint material 10 on the substrate 5 is brought into contact with the fixed mold 3. Alternatively, the imprint apparatus 1 may adopt an arrangement in which the imprint head 4 and the substrate stage 6 are driven vertically. That is, it is only necessary that the imprint apparatus 1 includes a driving device that brings the mold 3 into contact with the imprint material 10 on the substrate 5 by relatively bringing the imprint head 4 which forms the mold holder and the substrate stage 6 which forms the substrate holder close to each other.

The controller 8 includes, for example, a CPU 8a, the memory 8b, and the like and generally controls the respective units of the imprint apparatus 1.

Figure 2:
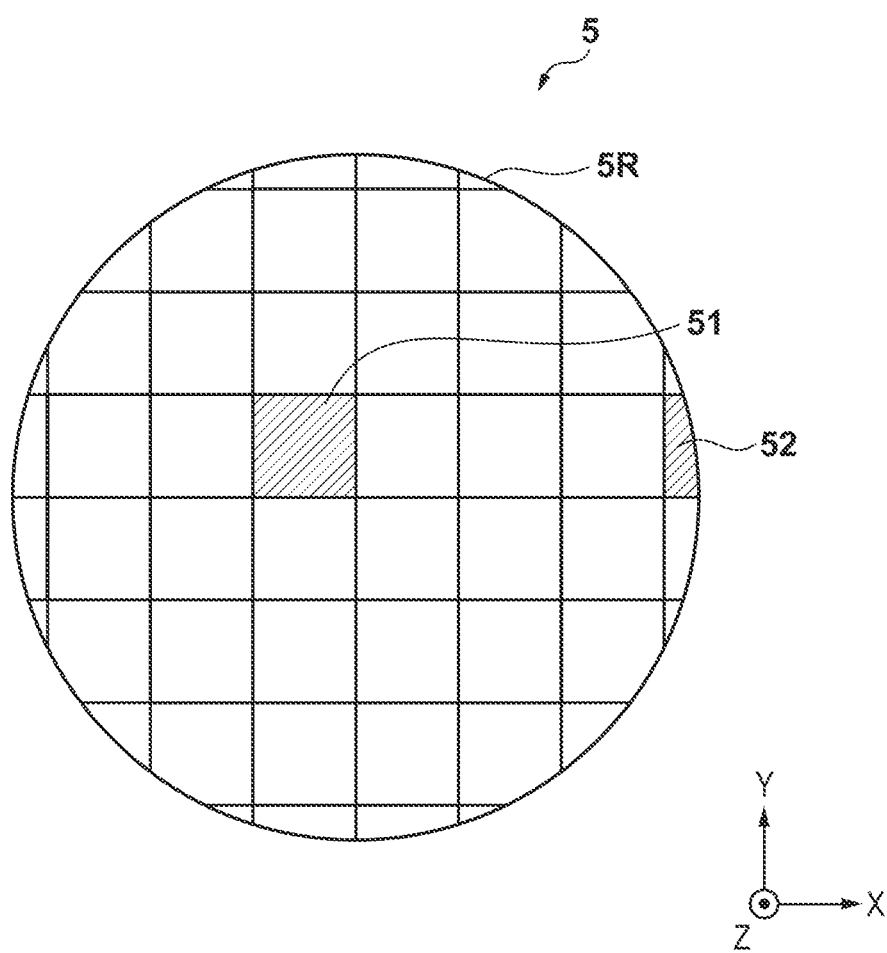
FIG. 2 is a view exemplifying the layout of shot regions on a substrate.

FIG. 2 is a view exemplifying the layout of shot regions on the substrate 5. In this specification, the shot regions refer to regions where patterns are formed in one imprint process. Target shot regions refer to shot regions where an imprint process is to be performed from now on. In the imprint apparatus 1, the dispenser 7 supplies the imprint material, and an imprint process is performed on the supplied imprint material each time the target shot region changes. The imprint process includes at least a step of bringing the mold 3 and the imprint material into contact with each other, a step of curing the imprint material, and a step of separating the cured imprint material and the mold 3 from each other. The plurality of shot regions are arrayed in a matrix on the substrate 5. In this embodiment, in order to maximize the effective area of the substrate 5 (the area of a region to which a pattern is transferred), the imprint process is performed not only on a shot region 51 inside the substrate 5 but also on a peripheral shot region 52 with a circumference 5R of the substrate 5. The peripheral shot region is a shot region partially extending off the circumference 5R of the substrate 5 and is also referred to as a "deficient shot region".

Figure 3A:
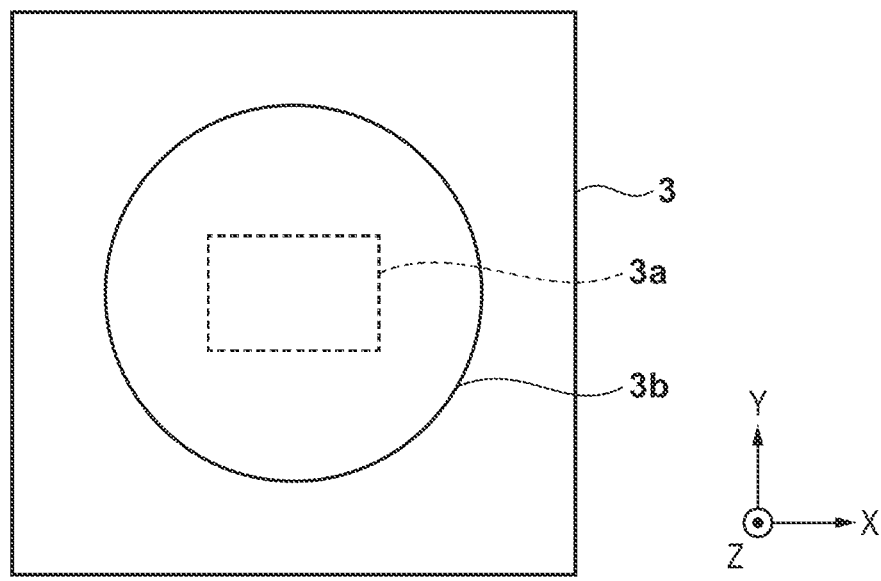
FIGS. 3A and 3B are views each showing the arrangement of a mold according to the embodiment.
Figure 3B:
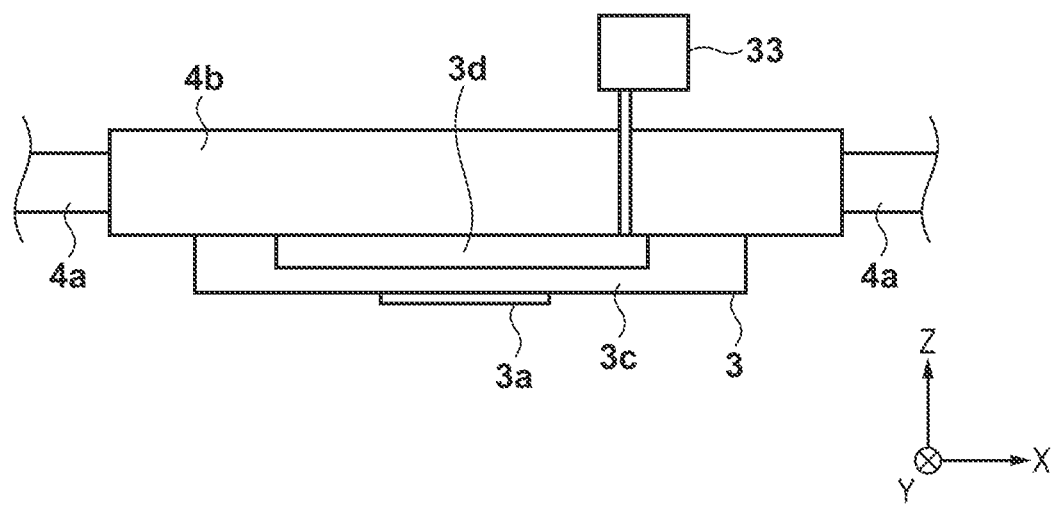

FIG. 3A is a view showing the back surface of the mold 3, and FIG. 3B is a sectional view showing the mold 3 corresponding to FIG. 3A and its peripheral main parts. The mold 3 has a concave portion 3b recessed into a predetermined shape by processing the back surface. This forms a thin portion 3c which remains by processing the back surface. The concave portion 3b has a size to include the mesa portion 3a. The mesa portion 3a is positioned at the center of the surface of the mold 3 and at the center of the thin portion 3c in a planar view. The mold 3 forms a core-out portion 3d of an enclosed space when it is sucked by the mold chuck 4b. A pressure regulating mechanism 33 is connected to the core-out portion 3d via a pipe, and can control the core-out portion 3d at a target pressure. Each of FIGS. 4A and 4B shows a case in which the mold 3 is deformed by applying a pressure to the core-out portion 3d.

Figure 4A:
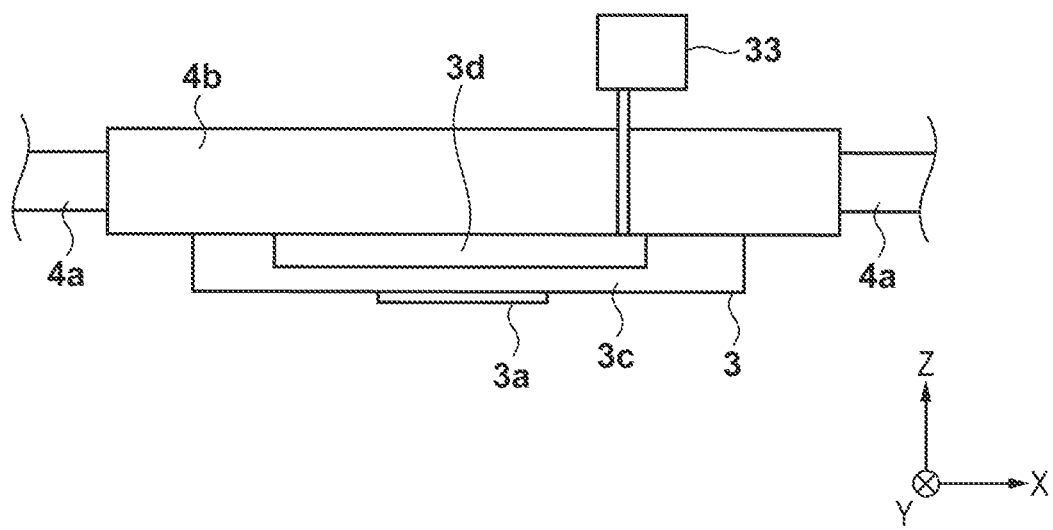
FIGS. 4A and 4B are views for explaining the control of the core-out portion of the mold.
Figure 4B:
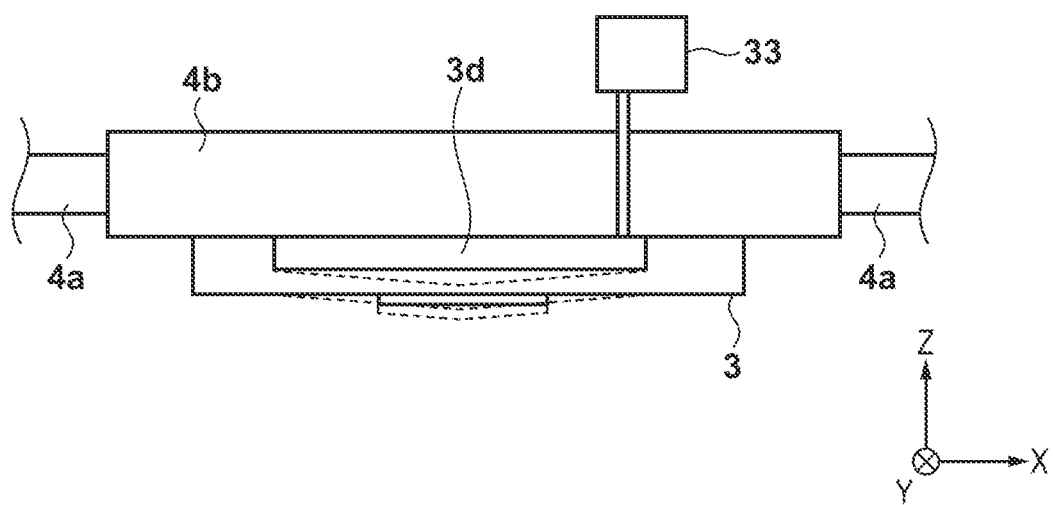

When the pressure regulating mechanism 33 applies the pressure to the core-out portion 3d in a state shown in FIG. 4A, the mold 3 is deformed in a direction so as to increase the volume, as shown by broken lines of FIG. 4B, and thus each of the thin portion 3c and the mesa portion 3a can be deformed into a downwardly convex shape (that is, a convex shape with respect to the substrate).

When the mesa portion 3a is brought into contact with the imprint material 10 supplied onto the shot regions of the substrate 5, the controller 8 applies a pressure to the interior of the core-out portion 3d by the pressure regulating mechanism 33 and deforms the mold 3 into a convex shape with respect to the substrate 5. Subsequently, the controller 8 brings the mold 3 close to the substrate 5 by the mold driving mechanism 4c in accordance with contact of the mesa portion 3a with the imprint material 10 on the substrate 5, decreases the pressure in the core-out portion 3d, and restores the mold 3 to be flat. This sequentially pushes out gasses between the mold 3 and the imprint material 10, and prevents bubbles from being trapped between the mold 3 and the imprint material 10.

Figure 5A:
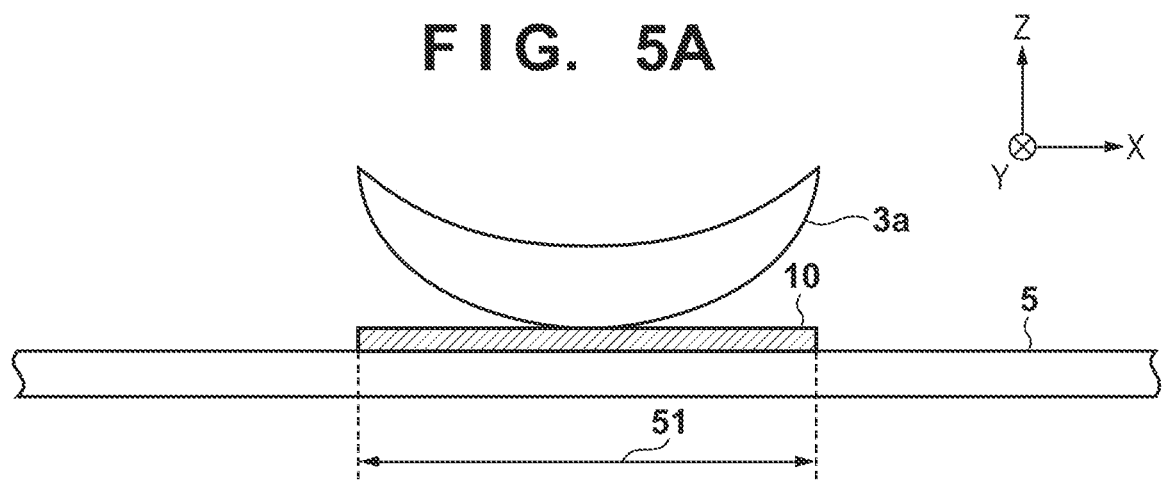
FIGS. 5A to 5C are views for explaining a process of deforming the substrate at the time of imprint in a peripheral shot region.

FIG. 5A shows a case when the mesa portion 3a is brought into contact with the imprint material 10 supplied onto the shot region 51 inside the substrate 5. FIG. 5A schematically represents that the pressure regulating mechanism 33 deforms the mesa portion 3a into the convex shape with respect to the substrate 5. The mesa portion 3a is deformed into the convex shape with respect to the substrate 5, and thus starts contacting the imprint material 10 from the center of the shot region 51.

Figure 5B:
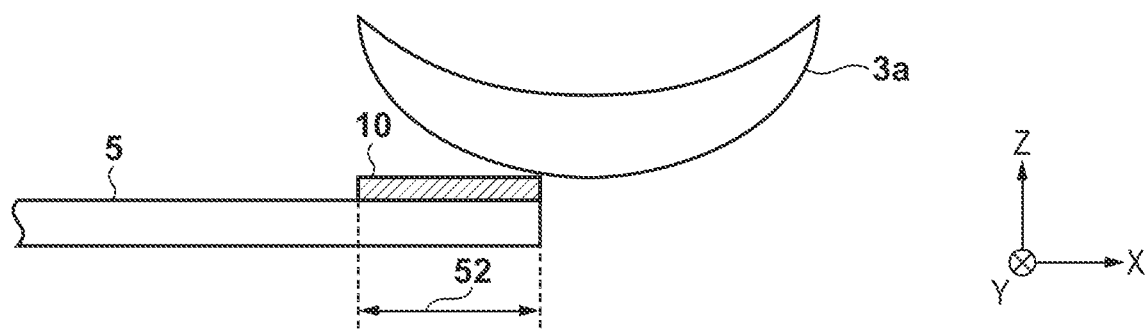

FIG. 5B shows a case when the mesa portion 3a is brought into contact with the imprint material 10 supplied onto the peripheral shot region 52 of the substrate 5 by a conventional method. In the case of the peripheral shot region 52, the mesa portion 3a starts contacting the imprint material 10 from the end of the peripheral shot region 52. In this case, the filling speed of the imprint material 10 to a concave pattern portion in the mesa portion 3a is slower, and an unfilled defect is more likely to be caused than in the case of the shot region 51 shown in FIG. 5A.

Figure 5C:
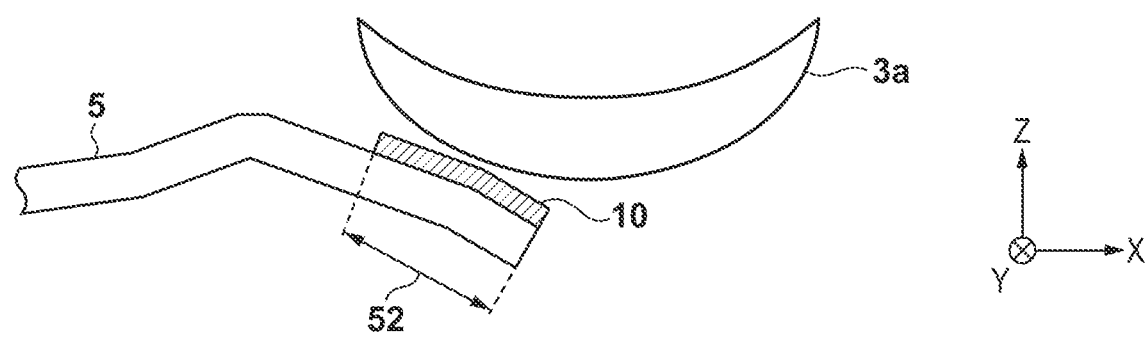

To cope with this, in this embodiment, the substrate 5 is deformed in an out-of-plane direction such that contact between the mesa portion 3a and the imprint material 10 is started from the center position of the peripheral shot region 52 as shown in FIG. 5C. That is, contact with the peripheral shot region 52 is started from a portion on a side closer to the substrate 5 with respect to the center of the mesa portion 3a than in the case shown in FIG. 5B.

Figure 6:
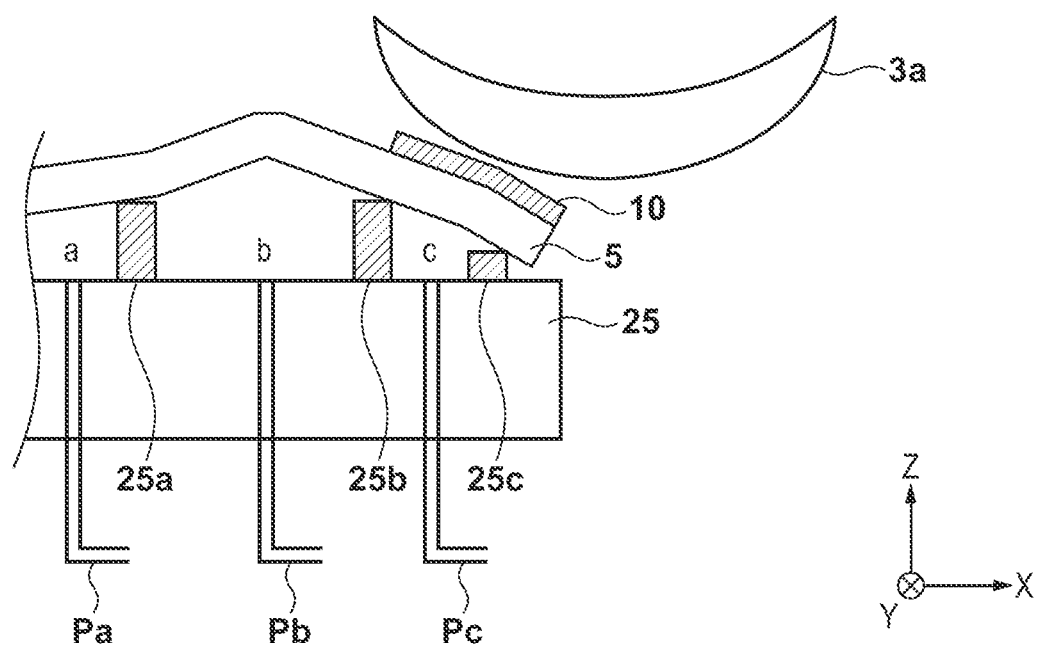
FIG. 6 is a view for explaining a mechanism for deforming the substrate.
Figure 7:
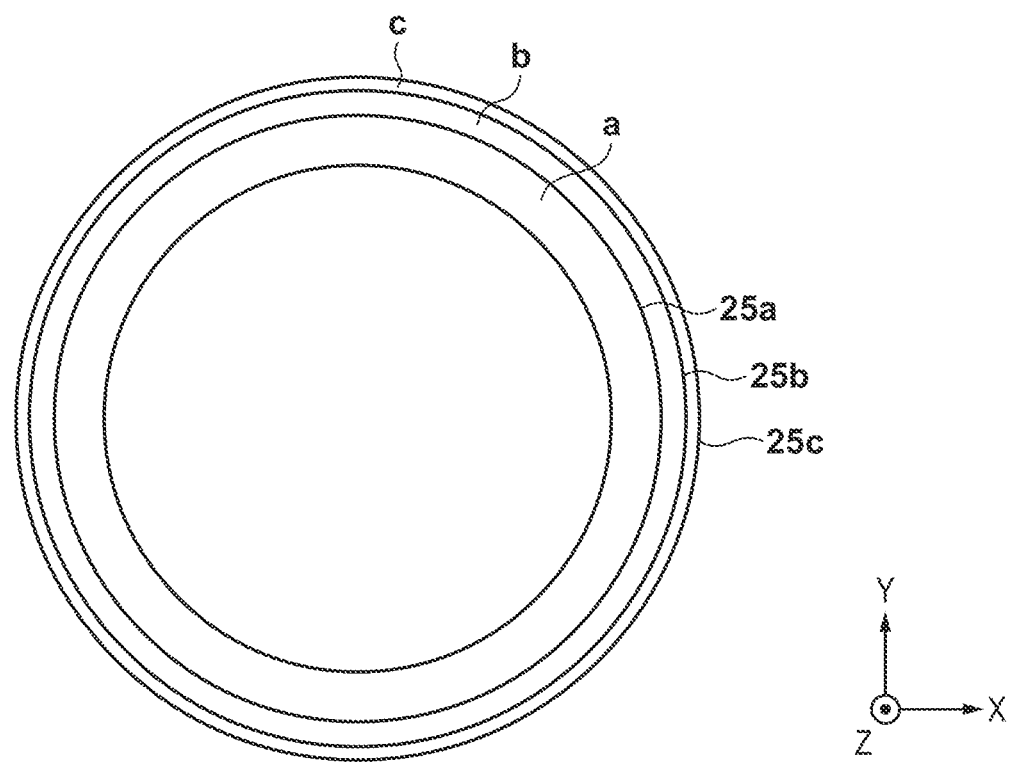
FIG. 7 is a view showing the arrangement of a substrate chuck.

FIG. 6 is a view showing an example of the arrangement of a mechanism that implements deformation in the substrate 5 shown in FIG. 5C. FIG. 7 is a plan view showing the substrate chuck 25 as viewed from the side of the mold 3. As shown in FIG. 7, a plurality of suction regions a, b, and c partitioned by a plurality of partitions 25a, 25b, and 25c are formed on the upper surface of the substrate chuck 25 (a surface facing the substrate 5). The plurality of suction regions a, b, and c are divided concentrically. In the example of FIG. 6, the plurality of suction regions a, b, and c are formed by providing the partitions 25a, 25b, and 25c upright on the upper surface of the substrate chuck 25. However, plurality of suction regions a, b, and c may be suction grooves formed by engraving the upper surface of the substrate chuck 25. The pressure regulator 6b shown in FIG. 1 communicates with the plurality of suction regions a, b, and c, respectively, via pipes Pa, Pb, and Pc and can regulate pressures insides the suction regions a, b, and c. Each of the suction regions a, b, and c forms a closed space with the substrate 5. The substrate 5 can be deformed by controlling the pressure inside this closed space. For example, while constraining the substrate 5 by setting the insides of the suction region a (first suction region) and suction region c (second suction region) at negative pressures with respect to an ambient pressure, the inside of the suction region b (third suction region) between them is set at a positive pressure with respect to the ambient pressure. The ambient pressure is, for example, the atmospheric pressure. This allows the peripheral portion of the substrate 5 in the suction region b to be deformed into a convex shape with respect to the mold 3 as shown in FIG. 6. In the example of FIG. 6, the partition 25c on the outermost circumference is lower in height than the other partitions inside the partition 25c. This makes it easier to deform the portion of the region c on the substrate 5 to have a falling gradient toward a circumferential side. By thus deforming the substrate, the imprint material 10 on the peripheral shot region 52 can start contacting the mesa portion 3a near the center of the peripheral shot region 52.

Figure 8:
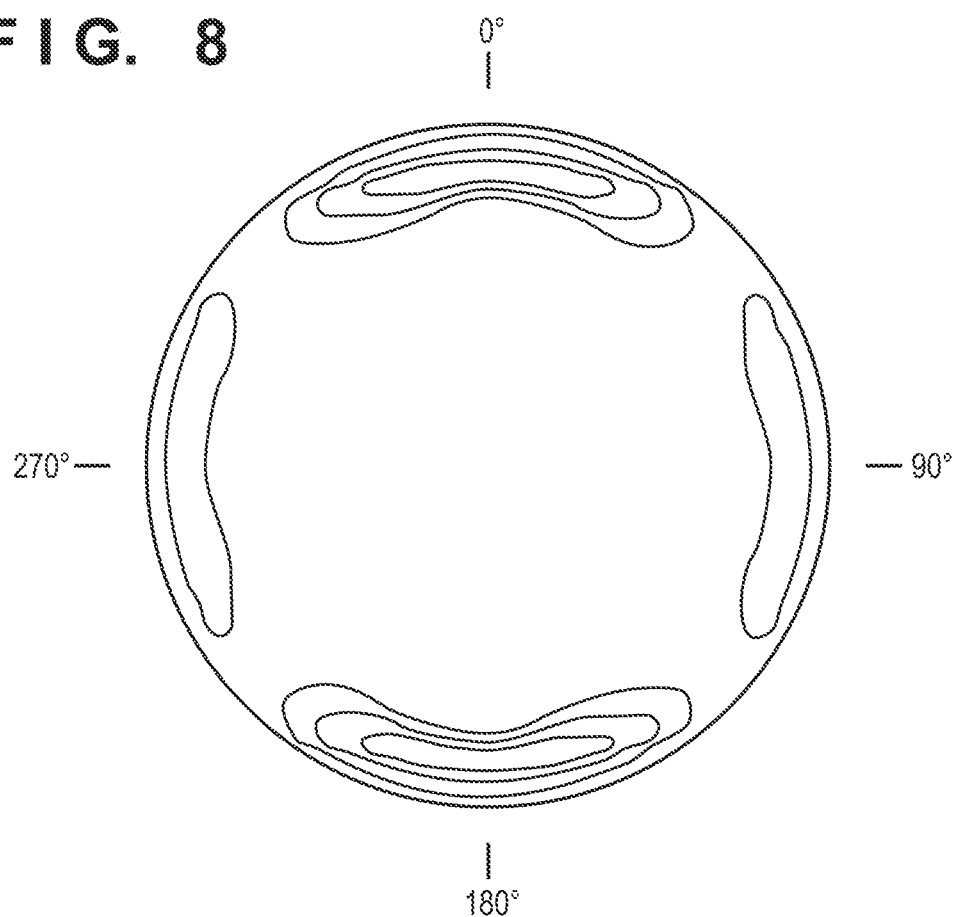
FIG. 8 is a view representing the three-dimensional shape of the substrate by contour lines.

FIG. 8 is a view representing the height of the substrate 5 by contour lines when the substrate 5 is placed on the substrate chuck 25, the insides of the suction region a and suction region c are set at the negative pressures, and the inside of the suction region b is set at the positive pressure. The height of the substrate is ideally uniform for each suction region. However, it never becomes uniform due to at least one of the processing accuracy of the suction region, the position of each partition, the processing accuracy of the height of the partition, the warpage of the substrate itself, and a conveyance error of the substrate 5. An example of FIG. 8 shows that parts at 0° and 180° are higher in degree of the convex shape than parts at 90° and 270°.

Figure 9:
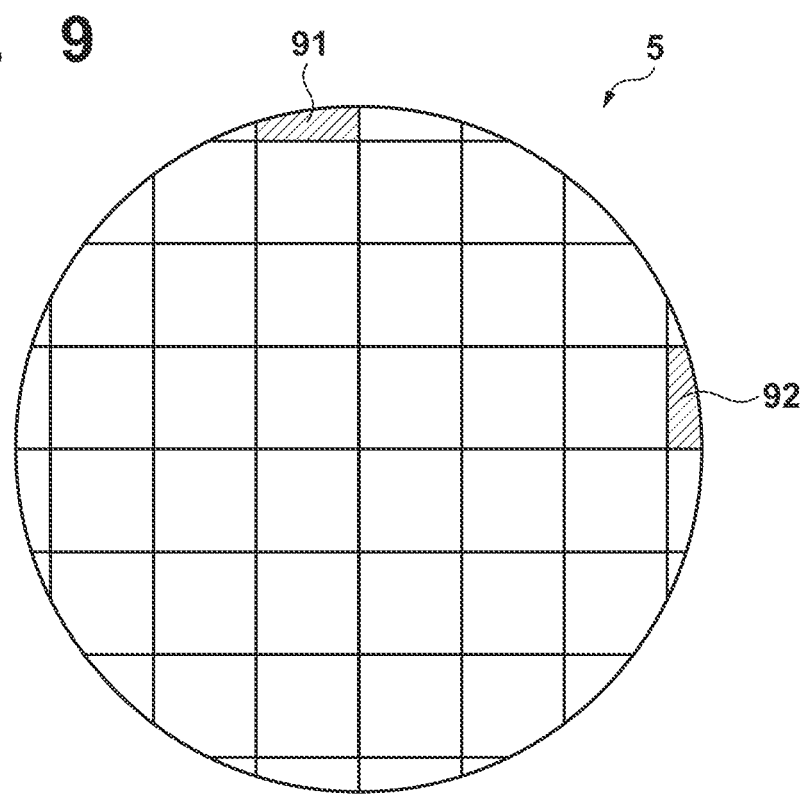
FIG. 9 is a view showing an example of peripheral shot regions.

In this embodiment, the position in the Z-axis direction is measured for each coordinate position of the substrate 5 by using, for example, the height measurement device 29. The imprint apparatus 1 generates map data (surface shape data) defining a relationship between a three-dimensional shape for each coordinate position of the substrate and the pressure (internal pressure) inside each suction region, and stores it in the memory 8b. Then, with reference to the map data, the controller 8 decides the internal pressure so as to obtain a target three-dimensional shape for each shot region. Consider a case in which, for example, the three-dimensional shape as shown in FIG. 8 is measured for the substrate 5. In this case, the degree of the positive pressure in the suction region b is set higher (the pressure is set higher) in a case in which a pattern is formed in a peripheral shot region 92 (a region on the side of 90°) of the substrate 5 shown in FIG. 9 than in a case in which a pattern is formed in a peripheral shot region 91 (a region on the side of 0°). Additionally or alternatively, the degree of the negative pressure in each of the suction regions a and c is set higher (the pressure is set lower). The pressures in the suction regions a, b, and c are regulated for each peripheral shot region such that the controller 8 compensates for a variation in height of the substrate 5 owing to the processing accuracy of the substrate chuck 25 or the like as described above. This makes it possible to make a shape in the out-of-plane direction on the periphery of the substrate 5 when the peripheral shot regions and the mold 3 are brought into contact with each other almost constant regardless of the positions of the peripheral shot regions.

Note that in the above-described example, the three-dimensional shape of the substrate is evaluated by using the height measurement device 29 exemplified in FIG. 1. However, another measurement device may be used. For example, a surface position detection apparatus arranged in a measurement station where a substrate stage different from the substrate stage 6 is positioned may be used. This surface position detection apparatus can include an oblique incidence optical system generally known in the field of a semiconductor exposure apparatus.

The three-dimensional shape of the substrate can also be evaluated by another method without using the height measurement device 29 or the above-described surface position detection apparatus. For example, an image capturing apparatus may capture the spread state of the imprint material 10 in a shot region at the time of imprint, and the three-dimensional shape of the substrate 5 may be evaluated based on resulting captured image data. FIGS. 10A and 10B show examples of the result of capturing the spread state of the imprint material 10 when the imprint process is performed on the respective peripheral shot regions 91 and 92 of FIG. 9. The following can be seen from the examples of images in FIGS. 10A and 10B. That is, in the peripheral shot region 92 shown in FIG. 10B, a contact start point 92a of the imprint material 10 is positioned on the end portion side of the peripheral shot region 92. In contrast to this, in the peripheral shot region 91 shown in FIG. 10A, a contact start point 91a of the imprint material 10 is positioned close to the center of the peripheral shot region 91. In addition, the peripheral shot region 91 is higher in speed at which the imprint material 10 spreads than the peripheral shot region 92. From the above, it can be seen that the degree of a convexity on the surface of the substrate 5 is higher in the peripheral shot region 91 than in the peripheral shot region 92.

FIG. 11 is a graph showing a relationship between the height of the imprint head and the driving current of a motor in the mold driving mechanism 4c that drives the imprint head 4 vertically along the Z-axis when the peripheral shot regions 91 and 92 are imprinted (the axis of the height is positive in a downward direction). A driving current for moving the imprint head 4 downward is first applied to the motor. When the imprint head 4 moves downward in accordance with this driving current, the mesa portion 3a contacts the imprint material on the substrate, and a driving current for further expanding the imprint material is added. That is, it can be seen that the mesa portion 3a and the imprint material are brought into contact with each other at a tilt change point of the driving current in FIG. 11. That is, contact with the imprint material is started at a position H1 where the imprint head 4 is higher in the peripheral shot region 91 than in the peripheral shot region 92 (H1>H2). Therefore, it can be said that the degree of the convexity is higher in the peripheral shot region 91 than in the peripheral shot region 92.

Figure 12:
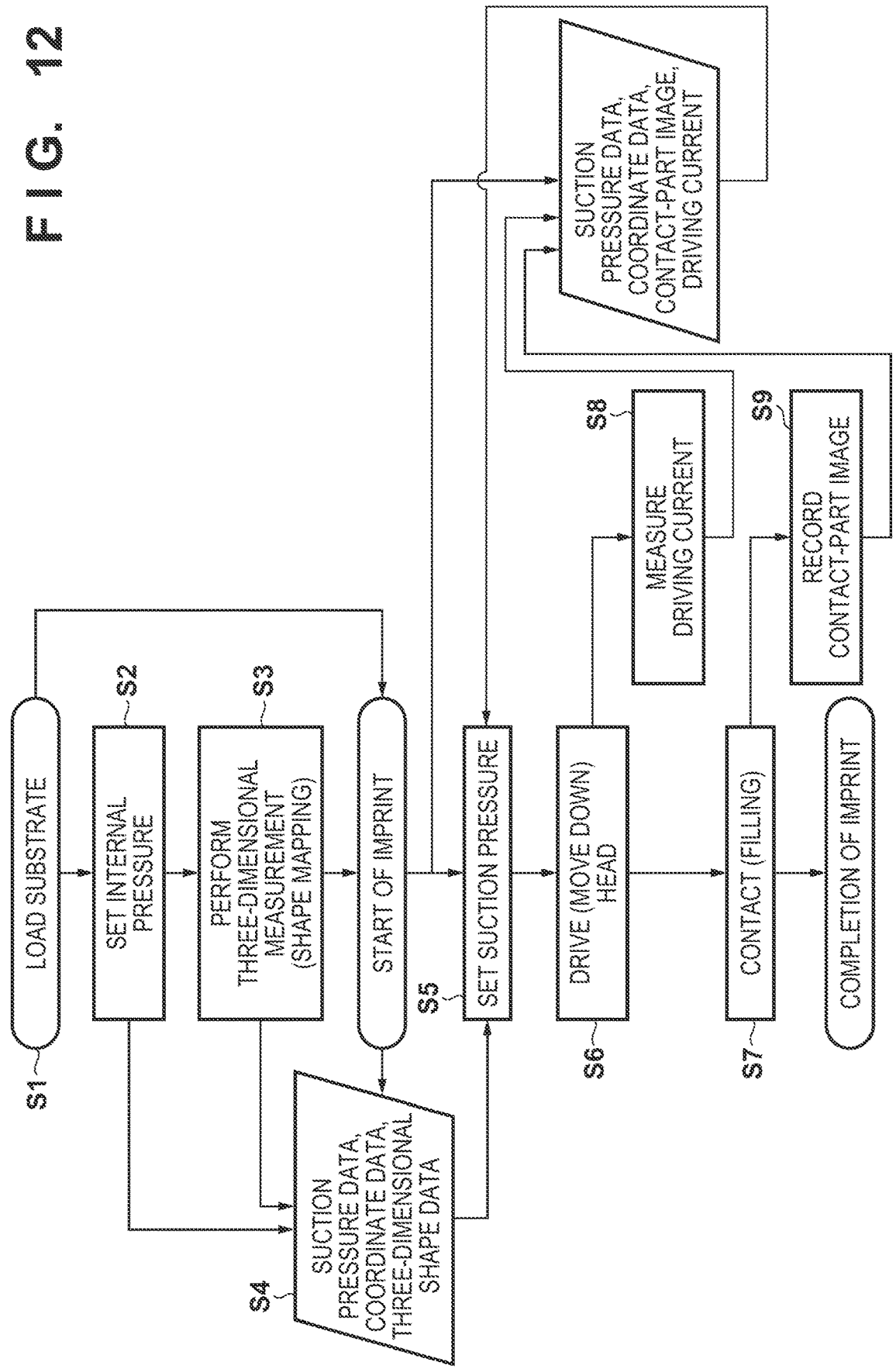
FIG. 12 is a flowchart showing the control of an imprint process according to the embodiment.

FIG. 12 is a flowchart showing the control of the imprint process according to the embodiment. In step S1, the controller 8 controls a substrate conveyance mechanism (not shown) to convey the substrate 5 onto the substrate stage 6 and causes the substrate stage 6 to receive the substrate 5. In step S2, the controller 8 controls the pressure regulator 6b to set the internal pressure in each suction region to a predetermined value. Subsequently, in step S3, the controller 8 controls the height measurement device 29 to perform mapping measurement on the three-dimensional shape of the substrate 5. In step S4, the controller 8 stores map data (pressure, coordinate, and shape) obtained by the measurement in the memory 8b. At the start of imprint, in step S5, the controller 8 sets the internal pressure in the target shot region based on the data on the internal pressure which is defined in the map data stored in the memory 8b such that the shot region obtains the target three-dimensional shape.

Figure 13:
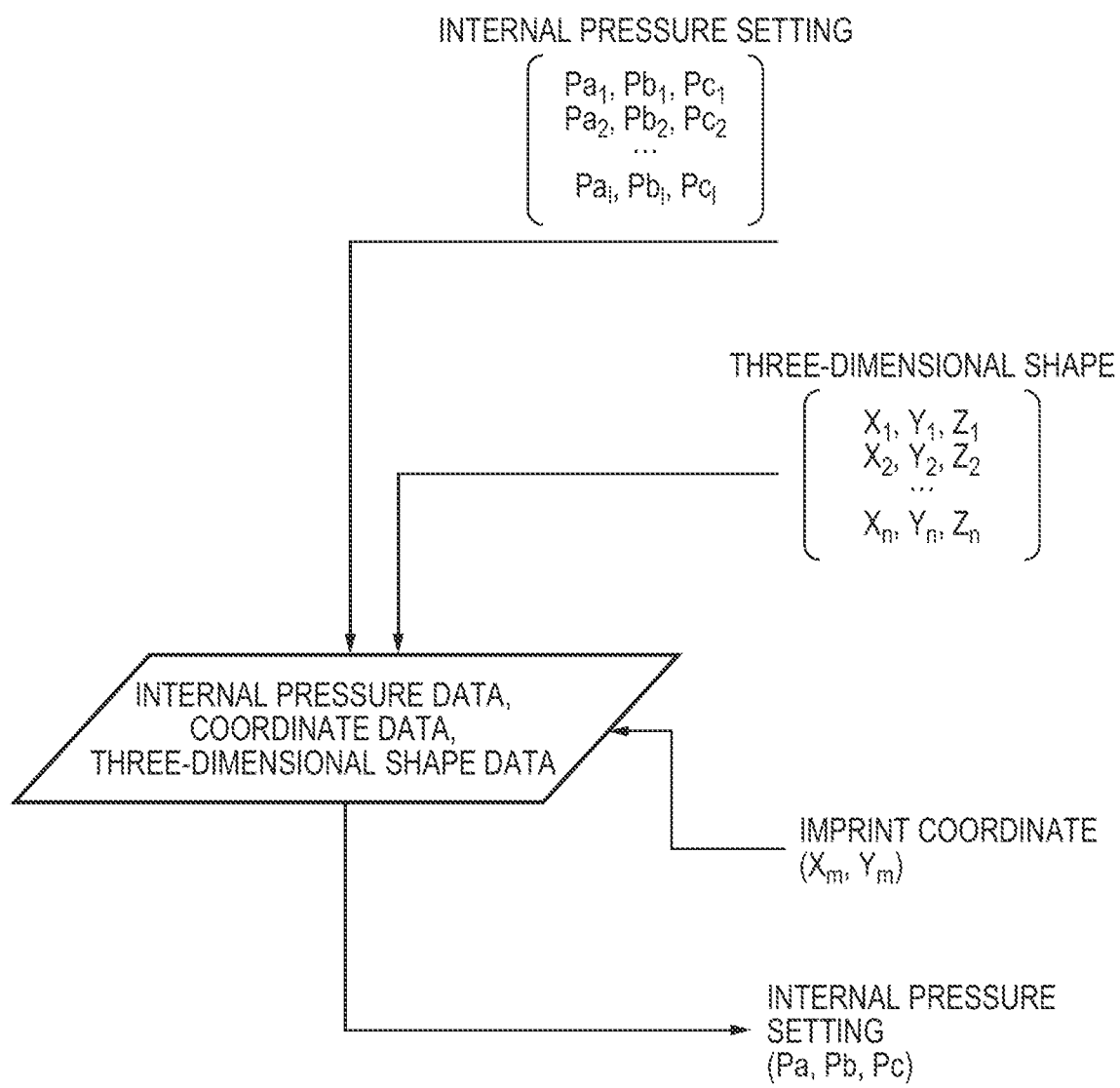
FIG. 13 is a view for explaining the update and use of map data.

The update and use of the map data will be described with reference to FIG. 13. First, in order to save a relationship between the internal pressures and the three-dimensional shape in the map data, the internal pressures in the suction regions a, b, and c are respectively set to ($Pa_1$, $Pb_1$, $Pc_1$). Then, mapping measurement is performed as the three-dimensional shape of the substrate 5 at coordinates ($X_{11}$, $Y_{11}$) is $Z_{11}$, and the three-dimensional shape at coordinates ($X_{21}$, $Y_{21}$) is $Z_{21}$, and stores them in the map data.

FIG. 14 shows an example of the data structure of the map data. In FIG. 14, a data column CL1 indicates the three-dimensional shape $Z_{11}$ to a three-dimensional shape $Z_{n1}$ at the coordinates ($X_{11}$, $Y_{11}$) to coordinates ($X_{n1}$, $Y_{n1}$) of the substrate 5 when the internal pressures are set to ($Pa_1$, $Pb_1$, $Pc_1$). A data column CL2 indicates a three-dimensional shape $Z_{12}$ to a three-dimensional shape $Z_{n2}$ at coordinates ($X_{12}$, $Y_{12}$) to coordinates ($X_{n2}$, $Y_{n2}$) of the substrate 5 when the internal pressures are set to ($Pa_2$, $Pb_2$, $Pc_2$). From a data column CL3, values of three-dimensional shapes and coordinates of the substrate when a pressure setting is changed are described in the same manner.

According to such map data, it is possible to decide internal pressures as ($Pa_1$, $Pb_1$, $Pc_1$) in a case in which, for example, a three-dimensional shape is adjusted to $Z_{n1}$ when the imprint process is performed on a position at coordinates ($X_{n1}$, $Y_{n1}$) of the substrate 5. In practice, as shown in FIG. 13, imprint coordinates can be arbitrary coordinates such as ($X_m$, $Y_m$). Therefore, an internal pressure for implementing the target three-dimensional shape is decided by, for example, searching for coordinates in map data closest to the coordinate or making an approximation from a neighboring value. This allows the controller 8 to change the pressure inside each suction region in accordance with the position of the shot region targeted for the imprint process.

Referring back to FIG. 12, the controller 8 performs the imprint process at the internal pressures set as described above. That is, the controller 8 moves the imprint head 4 downward (step S6), brings the mesa portion 3a into contact with the imprint material 10 on the substrate 5, and then the gap between the mesa portion 3a and the substrate 5 is filled with the imprint material 10 (step S7). The controller 8 measures the driving current of the motor in the mold driving mechanism 4c when moving the imprint head 4 downward in step S6 (step S8), and saves the measured value of the driving current in the map data. The controller 8 also saves, in the map data, captured image data (contact-part image data) obtained by capturing a state in which the imprint material 10 brought into contact with the mesa portion 3a in step S7 is expanded (step S9). Then, in the subsequent imprint process for the other shot regions, the decided internal pressures can be corrected by using the driving current of the motor and/or the contact-part image data.

Figure 15:
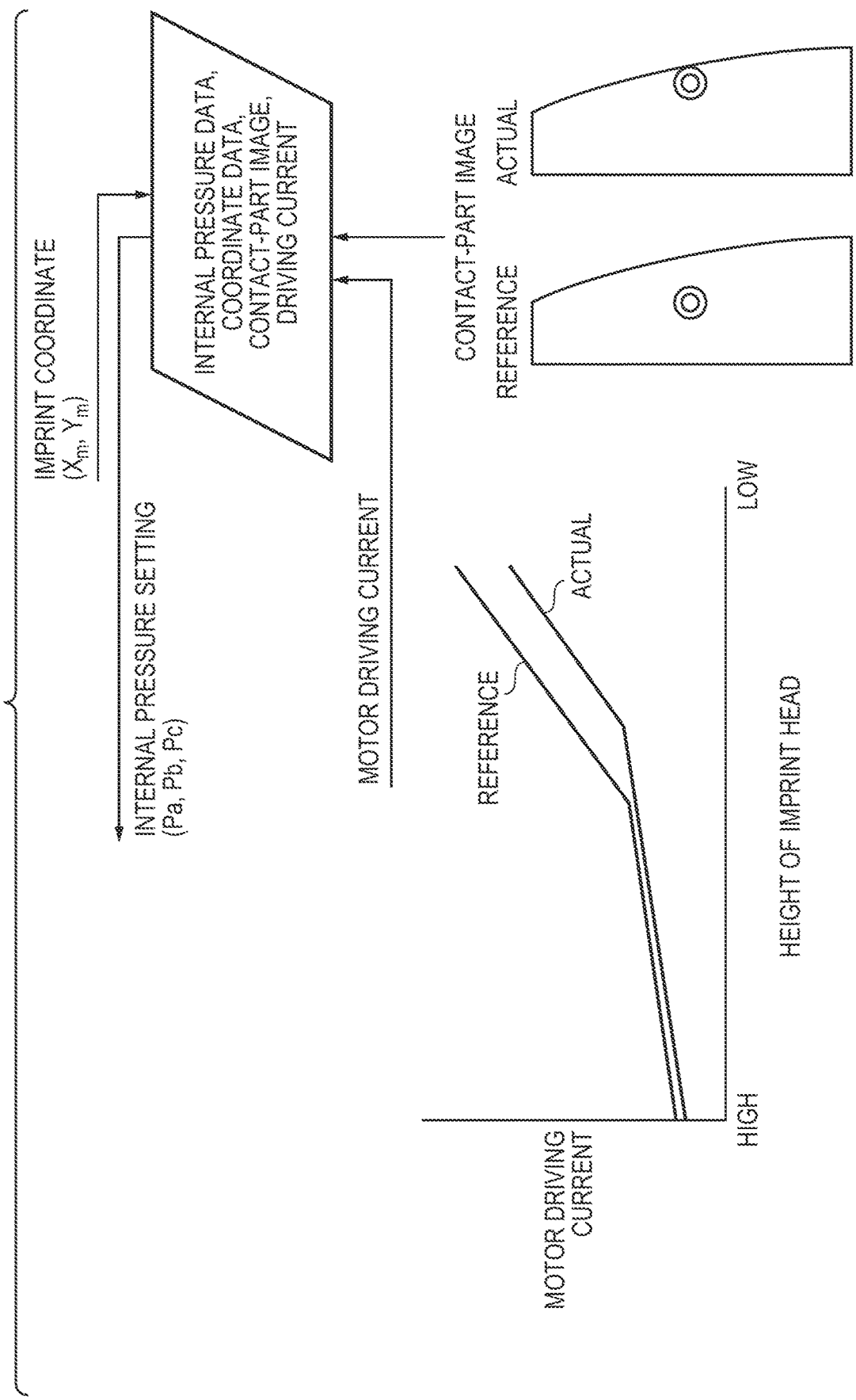
FIG. 15 is a view for explaining the update and use of the map data.

The update and use of the map data will further be described with reference to FIG. 15. When performing the imprint process, actual data on the height of the imprint head 4 and the driving current of the motor at this time is obtained. Referring to FIG. 15, in a graph indicating the relationship between the driving current of the motor and the height of the imprint head 4, an actual tilt change point is at the position of the imprint head 4 lower than a reference tilt change point. This means that in actual imprint, the mesa portion 3a does not contact the imprint material 10 at a reference height, and the contact is started at a position lower than this. That is, the three-dimensional shape of the substrate does not reach a reference shape, further correcting internal pressures (Pa, Pb, Pc).

Similarly, it can also be confirmed from the contact-part image data obtained at the time of imprint that an actual contact start point is outside the substrate relative to a reference contact start point between the mesa portion 3a and the imprint material 10. That is, it can also be seen from this information that the three-dimensional shape of the substrate does not reach the reference shape, further correcting the internal pressures.

As described above, it is possible to implement good imprint with less defect by controlling the internal pressures in order to set the substrate to a suitable three-dimensional shape at the time of imprint.

Embodiment of Article Manufacturing Method

A pattern of a cured product formed by using an imprint apparatus is used permanently for at least some of various articles or used temporarily when the various articles are manufactured. The article includes an electric circuit element, an optical element, a MEMS, a printing element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The mold includes, for example, an imprinting mold.

The pattern of the cured product is used without any change as a constituent member of at least a part of the above-described article or used temporarily as a resist mask. The resist mask is removed after etching, ion implantation, or the like is performed in a processing step of the substrate.

Figure 16:
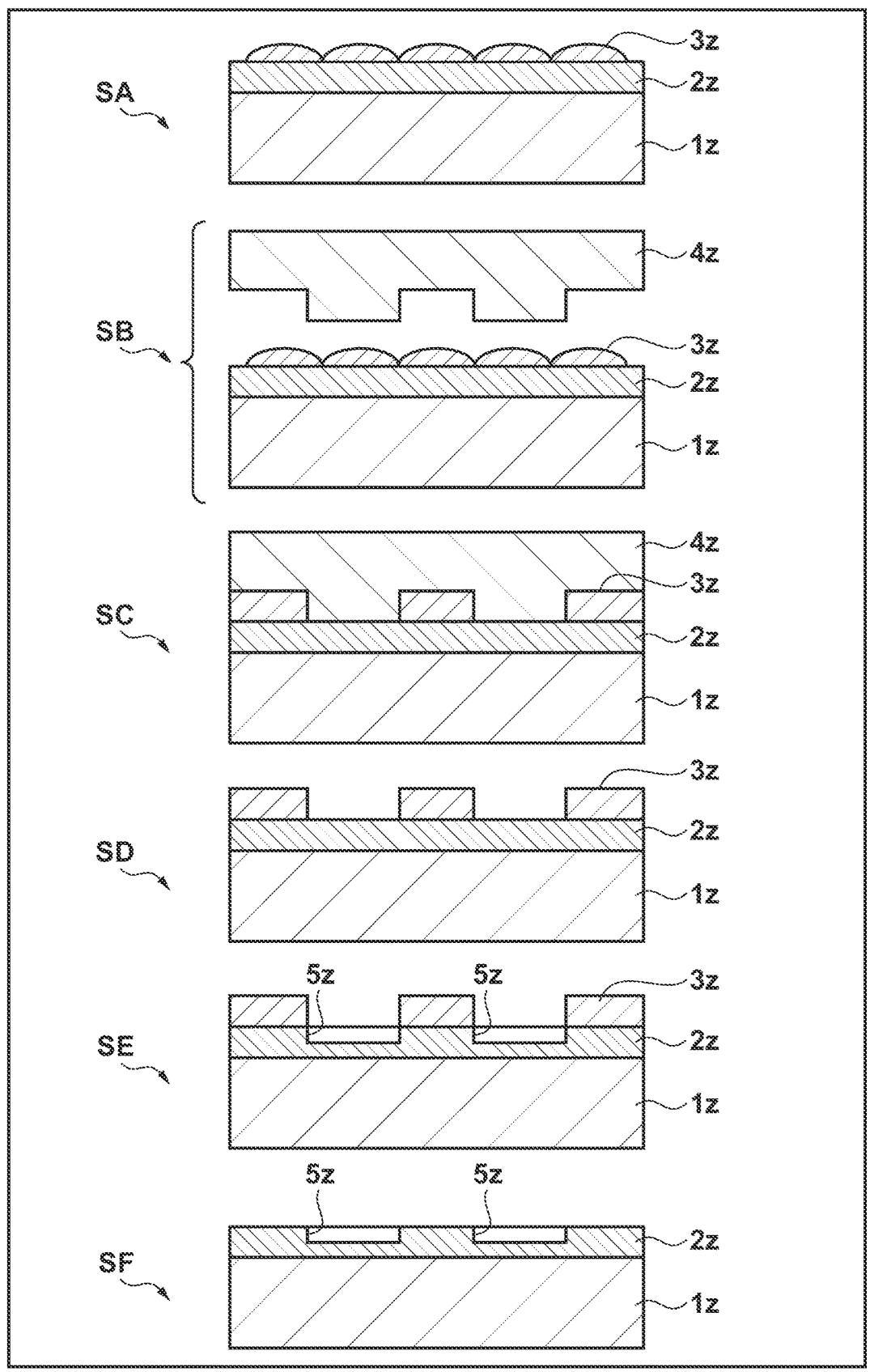
FIG. 16 is a view for explaining an article manufacturing method according to an embodiment.

An article manufacturing method will now be described with reference to FIG. 16. In step SA, a substrate 1z such as a silicon substrate having a processing target material 2z such as an insulator formed on its surface is prepared, and then an imprint material 3z is applied on the surface of the processing target material 2z by an inkjet method or the like. A state is shown here in which the imprint material 3z formed into a plurality of droplets is applied on the substrate.

In step SB, a side of an imprinting mold 4z on which its three-dimensional pattern is formed faces the imprint material 3z on the substrate. In step SC, the mold 4z and the substrate 1z to which the imprint material 3z is applied are brought into contact with each other, and a pressure is applied. The imprint material 3z fills the gap between the mold 4z and the processing target material 2z. The imprint material 3z is cured by irradiating it with light as curing energy through the mold 4z in this state.

In step SD, the pattern of the cured product of the imprint material 3z is formed on the substrate 1z by releasing the mold 4z and the substrate 1z from each other after curing the imprint material 3z. The pattern of this cured product has a shape conforming to the concave portion of the mold corresponding to the convex portion of the cured product. That is, the three-dimensional pattern of the mold 4z is transferred to the imprint material 3z.

In step SE, out of the surface of the processing target material 2z, portions without the cured product or portions where the cured products remain thin are removed and become grooves 5z by performing etching using the pattern of the cured product as an etching resistant mold. In step SF, an article having the grooves 5z formed in the surface of the processing target material 2z can be obtained by removing the pattern of the cured product. The pattern of the cured product is removed here. However, the pattern of the cured product may be utilized as, for example, an interlayer dielectric film included in the semiconductor element or the like, that is, the constituent member of the article without removing it after processing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-237089, filed Dec. 6, 2016, which is hereby incorporated by reference herein in its entirety.

What is claimed is:

1. An imprint apparatus that performs an imprint process of forming a pattern by bringing a mold into contact with an imprint material on a substrate, the imprint apparatus comprising:
   a mold holder that holds the mold;
   a substrate holder that holds the substrate by suction;
   a driving mechanism that brings the mold into contact with the imprint material by relatively bringing the mold holder and the substrate holder close to each other; and
   a controller, including a memory and a processor, that:
      controls an internal pressure of an enclosed space formed by the substrate holder holding the substrate;
      controls the driving mechanism during the imprint process;
      adjusts the internal pressure of the enclosed space based on surface shape data indicating a predetermined relationship between an internal pressure of the enclosed space and a surface shape of the substrate held by the substrate holder, to deform the substrate in an out-of-plane direction so that a shot region has a target shape that is convexing toward the mold; and
      controls the driving mechanism to start the contact in a state where the substrate is adjusted to have the target shape.

2. The apparatus according to claim 1, wherein the controller deforms the substrate into the target shape when the shot region is a peripheral shot region located on an outer periphery of the substrate.

3. The apparatus according to claim 1, wherein:
   the substrate holder includes a plurality of suction regions,
   the apparatus includes a pressure regulator that communicates with the plurality of suction regions and regulates internal pressures of enclosed spaces formed between the substrate and the respective suction regions,
   the plurality of suction regions are divided concentrically, and
   the controller deforms the substrate into the target shape by setting inside of a third suction region between a first suction region and a second suction region, among the plurality of suction regions, at a positive pressure with respect to an atmospheric pressure while setting insides of the first suction region and the second suction region at negative pressures with respect to the atmospheric pressure, and holding the substrate.

4. The apparatus according to claim 3, wherein a partition on an outermost circumference, among a plurality of partitions that partition the plurality of suction regions, is lower in height than other partitions.

5. The apparatus according to claim 3, wherein the controller decides pressure inside each of the plurality of suction regions for each shot region based on the surface shape data.

6. The apparatus according to claim 5, wherein the controller corrects the decided pressure based on captured image data obtained by capturing the imprint material in the imprint process.

7. The apparatus according to claim 5, wherein the controller corrects the decided pressure based on a driving current applied to the driving mechanism.

8. The apparatus according to claim 6, wherein the controller corrects the decided pressure further based on a driving current applied to the driving mechanism.

9. The apparatus according to claim 1, further comprising a measurement device that measures a height of the substrate held by the substrate holder, to obtain the surface shape data by a measurement result of the measurement device.

10. The apparatus according to claim 1, wherein the controller further controls the driving mechanism to bring the mold into contact with the imprint material in a state where the mold is deformed so that a pattern surface of the mold has a convex shape with respect to the substrate.

11. An imprint apparatus that performs an imprint process of forming a pattern by bringing a mold into contact with an imprint material on a substrate, the apparatus comprising:
   a mold holder that holds the mold;
   a substrate holder, including a plurality of suction regions, that holds the substrate by suction;
   a driving mechanism that brings the mold into contact with the imprint material by relatively bringing the mold holder and the substrate holder close to each other; and
   a controller, including a memory and a processor, that:

controls an internal pressure of an enclosed space formed by the substrate holder holding the substrate;

controls the driving mechanism during the imprint process;

adjusts the internal pressure of the enclosed space to deform the substrate in an out-of-plane direction so that a shot region, among the plurality of shot regions, to be subjected to the imprint process has a target shape that is convexing toward the mold;

controls the driving mechanism to start the contact in a state where the substrate is adjusted to have the target shape; and controls, in a case where the shot region, is a peripheral shot region located on an outer periphery of the substrate, controls a degree of convex shape of the substrate when the mold and an imprint material supplied to the peripheral shot region are brought into contact with each other by changing the internal pressure of the enclosed space in accordance with a position of the peripheral shot region on the substrate.

12. An article manufacturing method of manufacturing an article, the method comprising:

forming a pattern on a substrate by an imprint apparatus defined in claim 1; and processing the substrate on which the pattern has been formed, wherein the article is manufactured from the processed substrate.

13. An article manufacturing method of manufacturing an article, the method comprising:

forming a pattern on a substrate by an imprint apparatus defined in claim 11; and processing the substrate on which the pattern has been formed, wherein the article is manufactured from the processed substrate.

14. The apparatus according to claim 1, wherein the surface shape data defines a three-dimensional shape of the substrate held by the substrate holder.

15. The apparatus according to claim 3, wherein the controller, in a case where the shot region is the peripheral shot region, deforms:

the mold so that a pattern surface of the mold has a convex shape with respect to the substrate, and the substrate to a convex shape with respect to the mold so that contact between the pattern surface and the imprint material is started from the center position of the peripheral shot region.

16. The apparatus according to claim 1, wherein:

the surface shape data indicates the predetermined relationship between an internal pressure of the enclosed space and a surface shape of the substrate held by the substrate holder for each coordinate position of the substrate, and the controller adjusts the internal pressure of the enclosed space based on the surface shape data and a coordinate position of the shot region.

* * * * *